United States Patent
Satoh et al.

(10) Patent No.: US 9,029,822 B2
(45) Date of Patent: May 12, 2015

(54) HIGH DENSITY RESISTIVE MEMORY HAVING A VERTICAL DUAL CHANNEL TRANSISTOR

(71) Applicant: Avalanche Technology Inc., Fremont, CA (US)

(72) Inventors: Kimihiro Satoh, Beaverton, OR (US); Yiming Huai, Pleasanton, CA (US); Jing Zhang, Los Altos, CA (US); Dong Ha Jung, Pleasanton, CA (US)

(73) Assignee: Avalanche Technology, Inc., Fremont, CA (US)

( * ) Notice: Subject to any disclaimer, the term of this patent is extended or adjusted under 35 U.S.C. 154(b) by 27 days.

(21) Appl. No.: 13/843,644

(22) Filed: Mar. 15, 2013

(65) Prior Publication Data
US 2014/0138609 A1    May 22, 2014

Related U.S. Application Data

(63) Continuation-in-part of application No. 13/680,037, filed on Nov. 17, 2012, now Pat. No. 8,878,156.

(51) Int. Cl.
| | |
|---|---|
| *H01L 27/112* | (2006.01) |
| *H01L 27/24* | (2006.01) |
| *H01L 27/115* | (2006.01) |
| *H01L 27/22* | (2006.01) |

(52) U.S. Cl.
CPC ...... *H01L 27/11273* (2013.01); *H01L 27/2454* (2013.01); *H01L 27/11556* (2013.01); *H01L 27/228* (2013.01); *H01L 27/2463* (2013.01)

(58) Field of Classification Search
CPC ............. H01L 27/11273; H01L 27/11556; H01L 27/222; H01L 27/2454; H01L 21/823487
USPC ............. 257/263, 329, E29.131, E29.262
See application file for complete search history.

(56) References Cited

U.S. PATENT DOCUMENTS

| | | | |
|---|---|---|---|
| 5,244,824 A | 9/1993 | Sivan | |
| 6,300,207 B1 * | 10/2001 | Ju | 438/305 |
| 6,316,309 B1 | 11/2001 | Holmes et al. | |
| 6,335,239 B1 | 1/2002 | Agahi et al. | |
| 6,350,635 B1 | 2/2002 | Noble et al. | |
| 6,358,756 B1 | 3/2002 | Sandhu et al. | |
| 6,373,099 B1 | 4/2002 | Kikuchi et al. | |
| 6,399,979 B1 | 6/2002 | Noble et al. | |
| 6,449,186 B2 | 9/2002 | Noble | |
| 6,498,065 B1 | 12/2002 | Forbes et al. | |
| 6,504,201 B1 | 1/2003 | Noble et al. | |
| 6,794,699 B2 | 9/2004 | Bissey et al. | |
| 7,521,767 B2 * | 4/2009 | Lee et al. | 257/408 |

(Continued)

*Primary Examiner* — Joseph C Nicely
(74) *Attorney, Agent, or Firm* — G. Marlin Knight; Bing K. Yen

(57) ABSTRACT

Resistive memory cell array fabricated with unit areas able to be scaled down to 4 $F^2$, where F is minimum feature size in a technology node are described. Memory cells in a pair of cells commonly include a pair of buried sources in the bottom of trenches formed in a silicon substrate. The source line is shared with an adjacent cell. A pair of gate electrodes provides a vertical channel on a sidewall of the trench. A buried word line connects the bottom of the gates on the sidewall overlying the source wherein the word line is looped at the end of the array. A drain, which is self-aligned to the gate, is formed by implantation/doping the surface of the silicon before patterning the trenches. A contact is formed on top of the drain and the resistive memory element is fabrication on the contact.

10 Claims, 16 Drawing Sheets

(56) References Cited

U.S. PATENT DOCUMENTS

| | | | |
|---|---|---|---|
| 7,777,264 B2* | 8/2010 | Voshell et al. | 257/296 |
| 2004/0041188 A1* | 3/2004 | Bissey et al. | 257/297 |
| 2007/0015331 A1* | 1/2007 | Forbes | 438/257 |
| 2007/0145464 A1* | 6/2007 | Voshell et al. | 257/314 |
| 2007/0161188 A1* | 7/2007 | Fujii et al. | 438/257 |
| 2012/0040528 A1* | 2/2012 | Kim et al. | 438/675 |
| 2012/0058619 A1* | 3/2012 | Park et al. | 438/301 |
| 2013/0112982 A1* | 5/2013 | Forbes | 257/66 |
| 2013/0113029 A1* | 5/2013 | Chung et al. | 257/296 |
| 2013/0126819 A1* | 5/2013 | Satoh et al. | 257/4 |
| 2013/0320443 A1* | 12/2013 | Levin et al. | 257/337 |

\* cited by examiner

HIGH DENSITY RESISTIVE MEMORY HAVING A VERTICAL DUAL CHANNEL TRANSISTOR

RELATED APPLICATION

The present application is a continuation-in-part application of U.S. patent application Ser. No. 13/680,037, with filing date of Nov. 17, 2012, for MEMORY DEVICE HAVING STITCHED ARRAYS OF 4 F2 MEMORY CELLS, by SATOH et al., included by reference herein and for which benefit of the priority date is hereby claimed.

FIELD OF INVENTION

The disclosure is related to semiconductor resistive memory cell design, particularly to such devices that are controlled by an FET having a vertical channel and buried word line.

BACKGROUND

A cell size in a resistive memory is limited by a controller FET or the memory element itself, where sizes are scaled with minimum feature size F in a technology node. A unit area for placing the memory element includes the element and space in-between surrounding elements. The area of the unit can be reduced down to 4 $F^2$. On the other hand an access/controller transistor unit using a planer FET is limited down to 8 $F^2$, as found in experience with DRAM fabrication. Use of 3D FETs is necessary to downsize the memory cell below 8 $F^2$.

Considering an oval memory element with an aspect ratio r, dimensions of long and short axes are assumed as rF and F as shown in FIG. 1A, which illustrates a top view. The most packed placement of the memory element is when disposed with minimum space F. Dimensions (pitches) of the placement in both directions, (r+1)F and 2 F define a unit area as $2(r+1)F^2$, and in particular it becomes 4 $F^2$ when the memory element is a circle or square in a top view.

Placement of the access transistor also dominates cell size. Minimum pitch in channel width direction is 2 F as line and space of active area 1 F+isolation area 1 F. In channel direction 4 F is at least required as ½ F of isolation, 1 F of contact, 1 F of gate, ½ F of common source and 1 F (i.e. ½ F×2) of contact margin as shown in FIG. 1B. The minimum cell size never gets lower than 2 F×4 F=8 $F^2$ as long as a planar transistor is used.

A vertical channel transistor can be a solution to break through the 8 $F^2$ area size wall. H. Sunami teaches various applications using a surround gate transistor (SGT), in U.S. Pat. No. 6,373,099. By using a silicon pillar surrounded by a cylindrical gate and forming a vertical channel, the unit size can be scaled down to 4 $F^2$. There however are remaining issues to be solved in practice such as the features of a word line, a source line, a contact, and their fabrication process. The surrounding gate is fabricated on the sidewall of the pillar built in silicon substrate. A word line connects individual gates in one direction to make it work as a memory array. A mask process would be required to fabricate the word line, which faces two serious challenges of performing photolithography over a non-planarized surface and misalignment to the pillars. Fine lithography requires a flat surface. In addition there is no room left to allow misalignment since the distance between the transistors is assumed as 1 F.

Furthermore, the source element of the surrounding gate is defined by ion implantation. The whole area other than the surrounding gate is implanted. It is also hard to separate the source into individual source lines. Thus, it would not work other than for a plate source. It is also difficult to lower the resistance enough to maintain applied voltage. Voltage bouncing or propagation delay is a serious concern.

The present invention provides miniaturized resistive memory cells down to 4 $F^2$ with solutions for above issues.

SUMMARY

Embodiments of the present invention include resistive memory cells fabricated as a pair whose unit areas are able to be scaled down to 4 $F^2$, where F is minimum feature size in a technology node. Both memory cells in the pair commonly include a pair of buried sources in the bottom of trenches formed in a silicon substrate. The source line is shared with an adjacent cell. A pair of gate electrodes provides a vertical channel on a sidewall of the trench. A buried word line connects the bottom of the gates on the sidewall overlying the source wherein the word line is looped at the end of the array. A drain, which is self-aligned to the gate, is formed by implantation/doping the surface of the silicon before patterning the trenches. A contact is formed on top of the drain and the resistive memory element is fabrication on the contact. A bit line connects the memory elements in a direction crossing the trench.

A cell in an embodiment includes a memory element, a drain, a left gate, a right gate and a pair of source lines (each source line is shared with next neighbor cell). The drain is located directly under the memory element and the gates and source line are located between the memory elements. The left and right gates are connected at the ends of the array. The drains are located on top of pillars of silicon that are formed by patterning first and second sets of intersecting trenches. An extension layer, which is doped to have the opposite type of conductivity than the substrate, is formed on the lower sidewalls of the pillars adjacent to the source line. The source lines are formed in the bottom of the trenches in contact with the extension layer but the extension layer extends farther up beyond the top of the source line to provide the channel area for the gate. Two (unconnected) gates are positioned in the trench above the source line and vertically overlap with the extension layers on opposite sidewalls of the adjacent pillars to provide the channels. One of the gates in a trench controls the memory element on one side of the source and the other gate in a trench controls the memory element on the other side of the source. Thus, a vertical control transistor is formed with a source line at the bottom of a trench, a gate positioned above the source and a drain being positioned farther up. The extension layer provides a vertical channel between the source and gate.

Embodiments of the invention use a three dimensional stitching scheme to connect the lines to peripheral circuit such as a decoder.

Process embodiments to fabricate the memory device are also part of this invention. Starting with p-type silicon, as an example, n type species are implanted in surface of the substrate silicon. The n-type layer becomes a drain of the vertical FET. A first set of parallel trenches is formed, then filled with dielectric material. A second set of trenches, perpendicular to the first set, with a pitch 2 F is built in the silicon substrate. The trenches are deepened after oxidizing inside to protect sidewall. The extension layer is formed on the sidewall by lightly diffusing the n-type species for example with a spike anneal. For the source line highly concentrated n+ poly-silicon is deposited/plugged into the trenches. The plugged poly-silicon is recessed down under the sidewall extension layer. The remaining first sidewall oxide inside of the trenches is removed. The gate dielectric layer is then formed by oxidizing the sidewalls and the top of the poly-silicon source line. The conductive material for the gate electrodes is then deposited into the trench. A thickness of n-type poly-silicon or metal thinner than one half of the trench width is deposited and vertical etched to separate into a pair of sidewall spacers on top of the gate electrode material in the trench. The unmasked center portion of the gate electrode material in the trench is etched away. Silicon dioxide is filled and planarized with CMP. The contacts are then fabricated on the drains, and the memory elements are fabricated on the contacts. Bit line interconnection follows.

DESCRIPTION OF THE DRAWINGS

FIG. 1A and FIG. 1B illustrate top views of prior art and FIG. 1C illustrates three dimensional view of a prior art.

DETAILED DESCRIPTION OF THE INVENTION

In the following description of the embodiments, reference is made to the accompanying drawings that form a part hereof, and in which is shown by way of illustration of the specific embodiments in which the invention may be practiced. It should be noted that the figures discussed herein are not drawn to scale and do not indicate actual or relative sizes. Any hatching in the figures is used to distinguish layers or structures and does not represent the type of material used. A plurality of arrays of magnetoresistive random access memory (MRAM) cells are typically fabricated simultaneously on a single wafer. The figures and description herein reference examples of one or more cell structures of the plurality of cell structures that will be typically be fabricated simultaneously on a single wafer. While this invention hereafter describes an n-MOS embodiment for convenience, p-MOS embodiments can be achieved by switching n-types and p-types according to standard techniques.

Figure 1A:
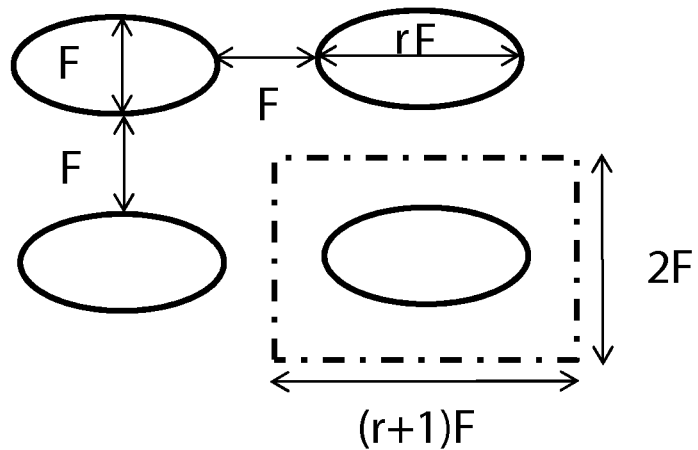
Figure 1B:
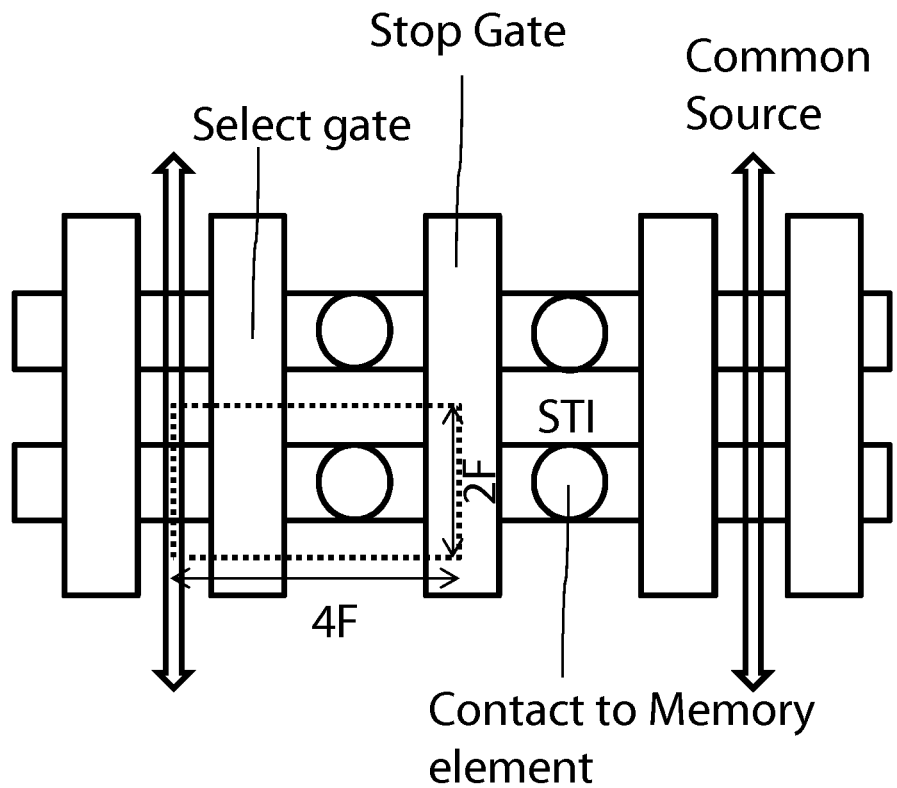
Figure 2A:
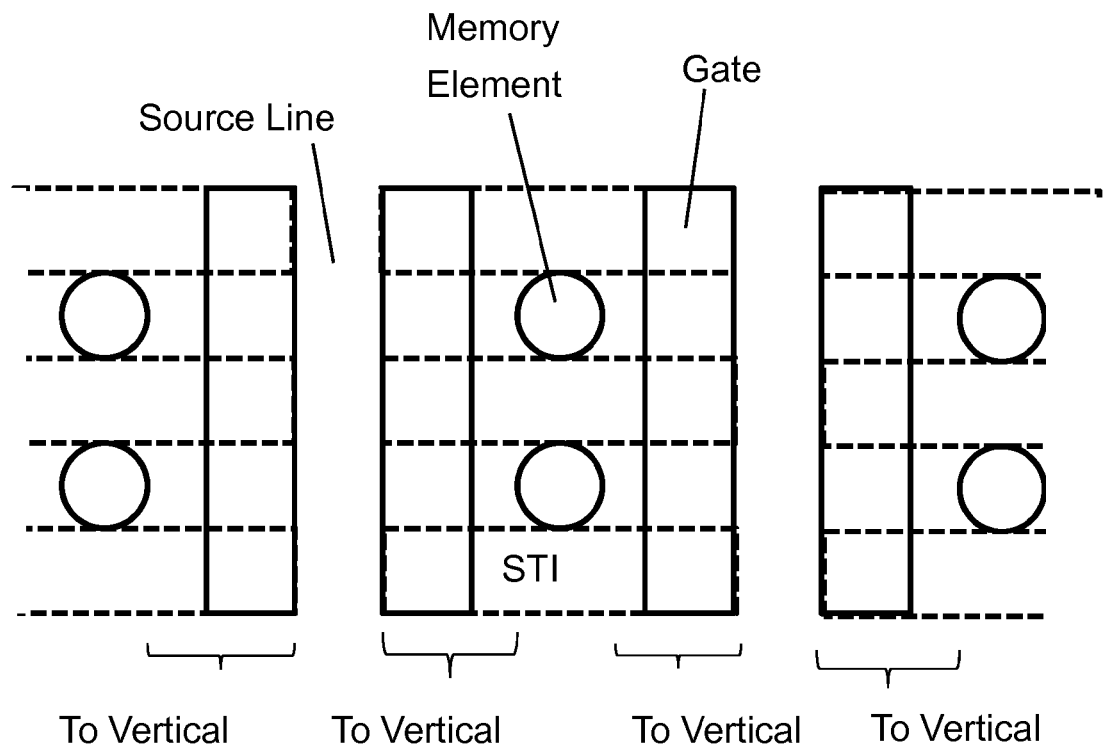
FIG. 2A illustrates a top view planar structure of according to the prior art.
Figure 2B:
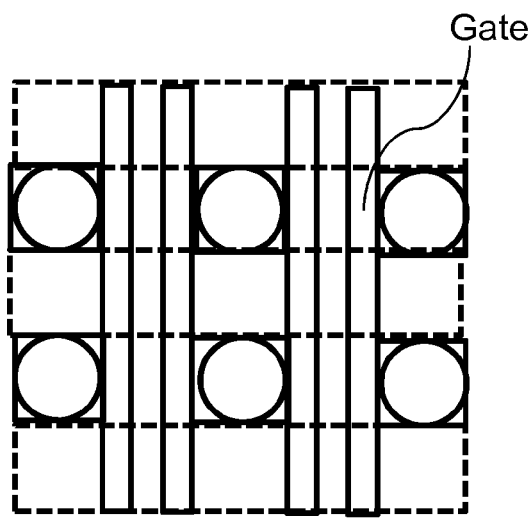
FIG. 2B illustrates a top view of an embodiment of the invention.

The embodiment transforms a prior art horizontal channel as illustrated in FIG. 2A to a vertical channel as illustrated in FIG. 2B wherein the channel width is bounded by isolation dielectrics such as STI (Shallow Trench Isolation).

The memory cell array is architected as a plurality of bit lines connecting memory cell elements with a minimum pitch 2 F. The pair of FET gates are disposed on each sidewall of the pillars to provide vertical channels with a pitch (r+1)×F wherein r is ratio of long axis of a memory element to short axis, the plurality of word line connect the gates in the first direction wherein the word lines loop the shared ridge, and the second plurality of bit lines connect the memory elements in the second direction crossing the first direction. The word line and the source line are disposed along the first direction. Metal stitching lines are required to connect the lines to peripheral circuit such as a decoder. Two metal lines are required in 2 F pitches for a word line and a source line individually. Minimum line and space rule is 2 F therefore three dimensional stitching scheme is required including contact placement.

Since a vertical channel does not contribute to the cell area defined in surface plane, it allows reducing 1 F in channel length compared to a planar channel. The structure does not need cell isolation such as STI or a stopping gate. Also since contact margin to a gate is in the vertical direction, it is not counted in cell area. Therefore the cell width in the second direction can be reduced to 2 F. The cell height in the first direction is (r+1)×F. Then a memory cell area with memory element r=1 can be sized down to 2 F×2 F=4 $F^2$.

Furthermore unique features of this device according to the invention provide additional benefits. Operation current is provided through dual channels so that the current drivability can be twice that of a planar channel FET having the same channel length. The buried source is able to lower its resistance by increasing the depth and/or increasing dopant concentration. The buried word line allows connecting individual gates without area penalty.

A memory cell is selected with a bit line, a word line and a pair of source lines. A selected word line is applied by positive voltage to open the channel and other word lines are grounded to shut the channel off. A selected bit line is applied by positive voltage at write "1" mode or read mode and grounded at write "0" mode. Opposite voltage set is applied to other bit lines. A selected source line pair is grounded or applied at write "1" mode or write "0" mode respectively.

Cell Structure

Figure 3:
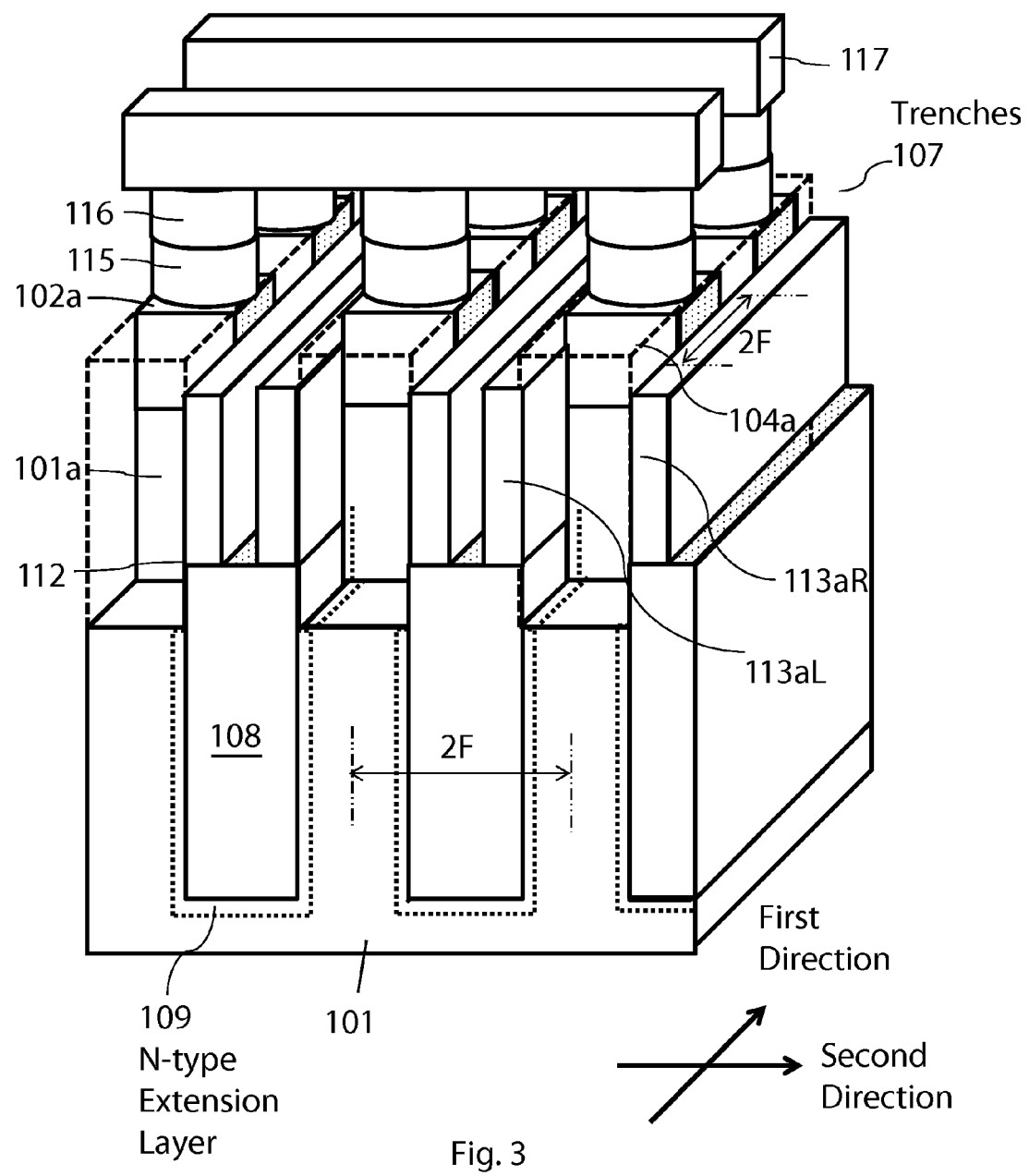
FIG. 3 illustrates 3-dimensional view of an embodiment of the invention.
Figure 4:
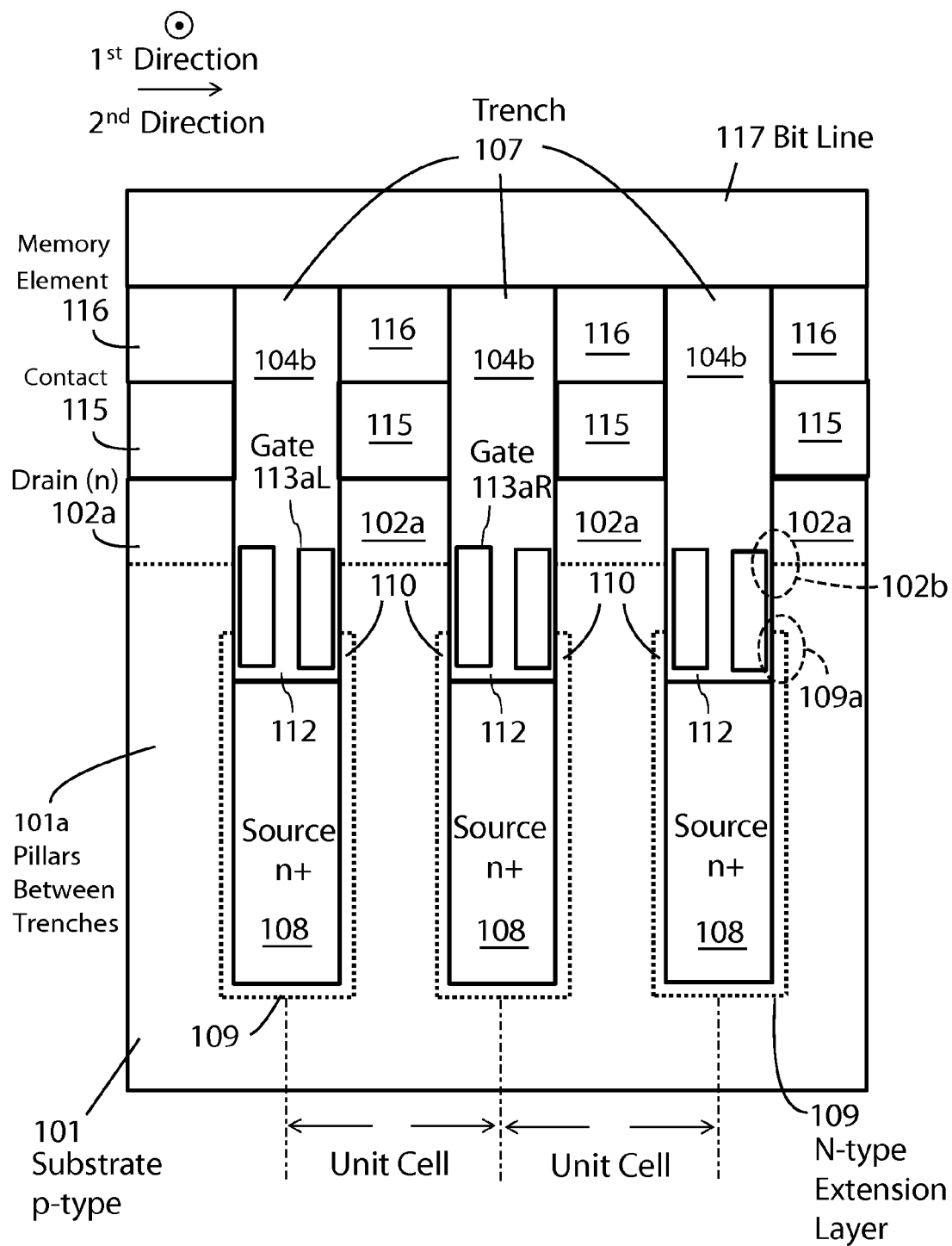
FIG. 4 illustrates cross sectional view of an embodiment of the invention.

Three dimensional structure of the first embodiment is illustrated in FIG. 3. Dielectric layers that isolate devices are omitted for easier understanding. A cross sectional view taken perpendicular to the surface of the wafer including a bit line 117 is illustrated in FIG. 4 to aid in understanding. The method of fabrication described below and illustrated in FIGS. 9-15 also aids in understanding the resulting structure.

Figure 10:
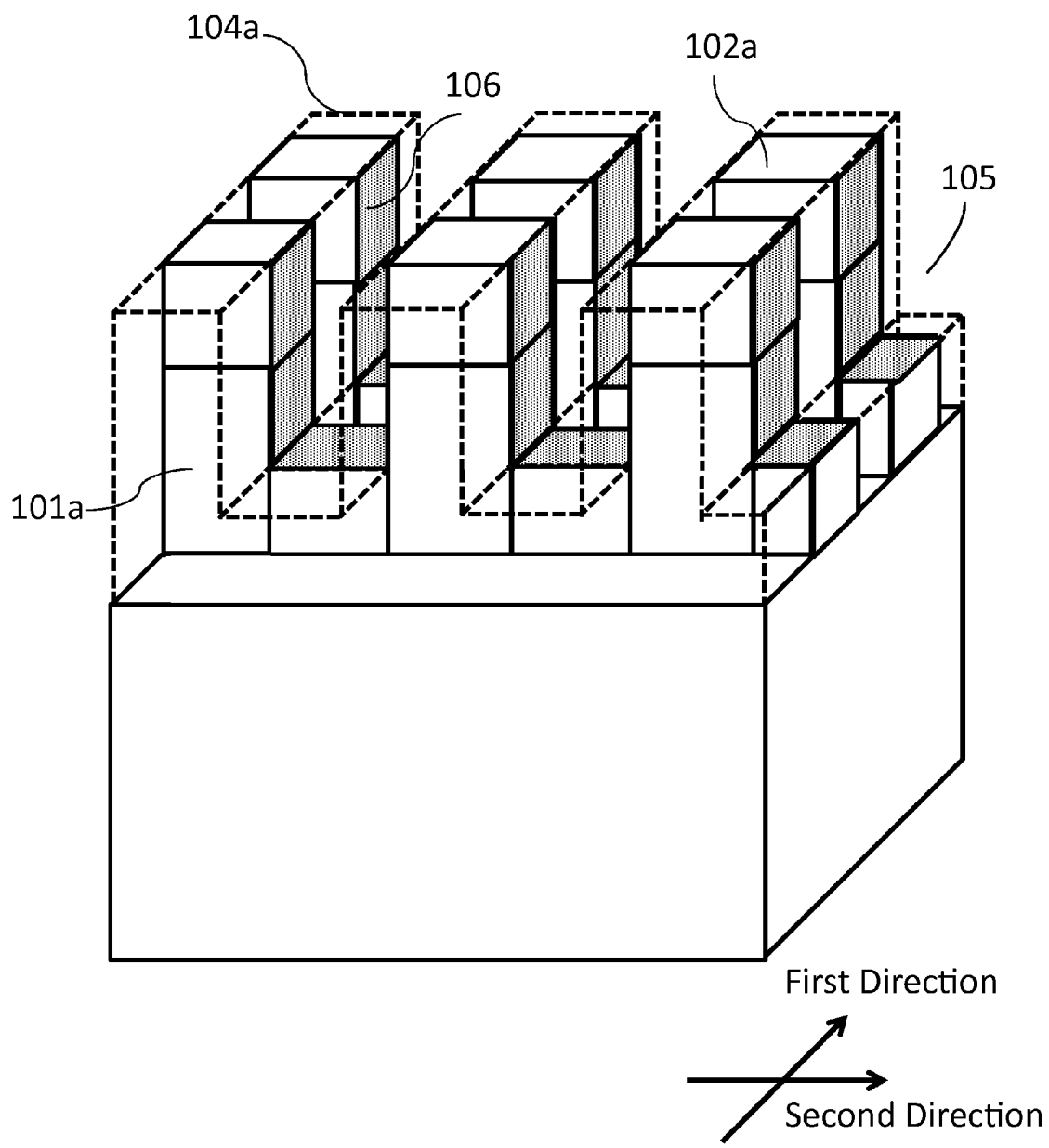

With reference to FIG. 4, a plurality of parallel trenches 107 built in p-type silicon substrate 101 are disposed in the first direction with an equal pitch. These trenches include the source and gate lines as will be described below. The source line 108 is made of a conductive material such as highly doped poly-silicon that is plugged into bottom of the trench 107. The source line is shared with a pair of adjacent channels 110 on opposing sides of the source line, facing each other in the trench. An n-type extension layer 109, which is built into the sidewall of the trench in the substrate by diffusion before the source line material is deposited, laterally surrounds/covers the source line and extends upward beyond the top of the source line along sidewall of the trench. When the trenches 107 are etched into the substrate 101a series of parallel ridges are formed. The ridges consist of alternating pillars 101a of silicon and dielectric material 104a as shown in FIG. 10. The tops of the pillars 101a have been implanted with n-type species which allows them to serve as drains 102a. The upper area of the trenches 107 is filled with dielectric material 104b which isolates the adjacent structures which include the memory elements 116 and contacts 115. A contact stud 115 is placed on top of the drain 102a. The memory elements 116 are then fabricated on the contact stud. The memory elements are connected with a bit line 117 along the second direction.

Figure 4A:
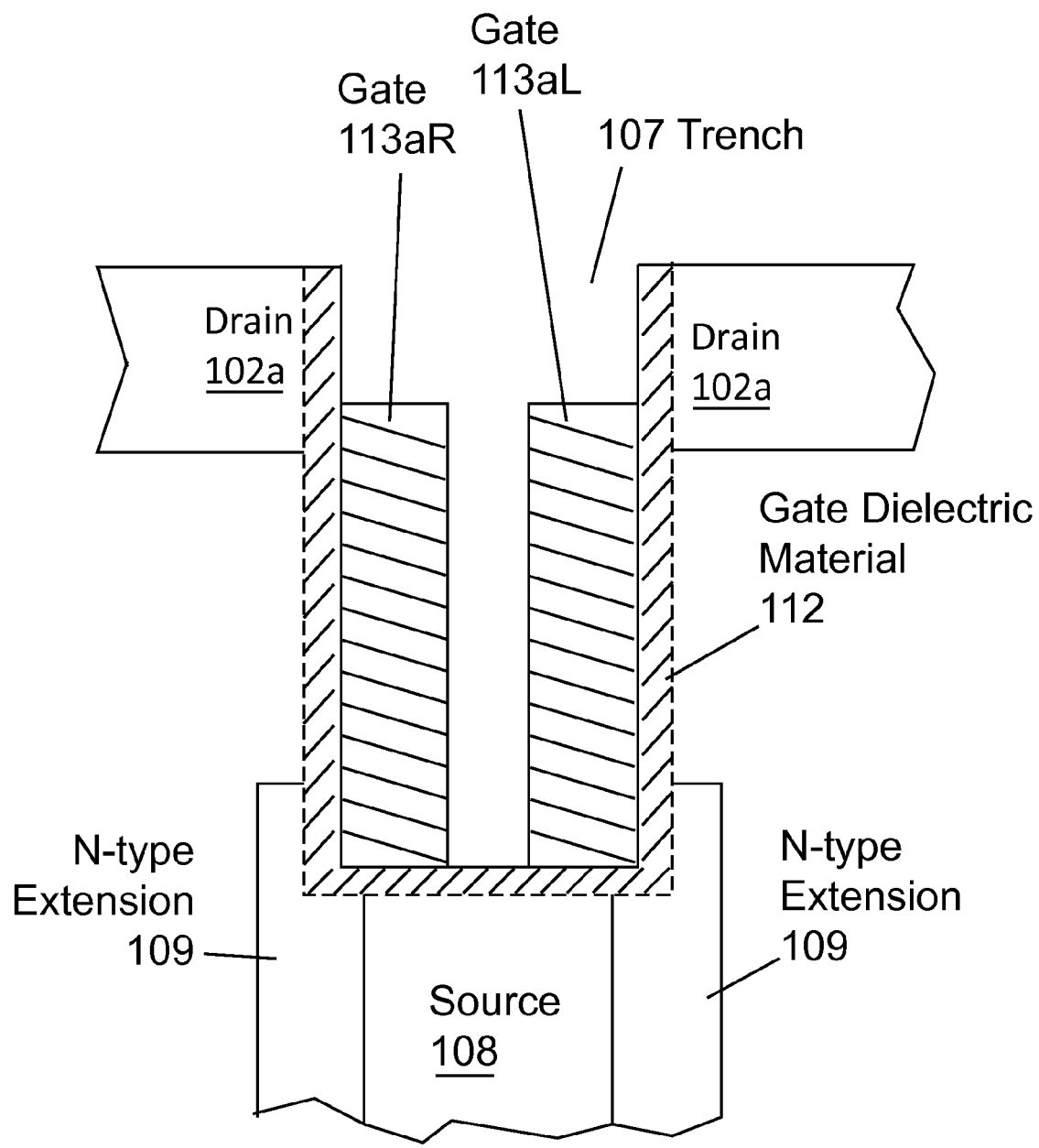
FIG. 4A illustrates cross sectional view vertical transistor elements according to an embodiment of the invention.

FIG. 4A illustrates an enlarged cross sectional view the vertical transistor elements according to an embodiment of the invention. A pair of gates 113aR, 113aL are formed in the trench immediately above the source line 108. The gates are separated from the source line 108, the n-type extension layer 109 and the drains 102a by a thin layer of gate dielectric material 112 which serves as isolation material, as well as the gate dielectric. The gate dielectric material 112 in this embodiment is achieved by oxidizing the exposed silicon in the walls of the trench and the top of the source before the gate material is deposited in the trench. Thus the gate dielectric material 112 in this embodiment is silicon dioxide. The gate dielectric material 112 can also be formed, for example, simply by oxidation or combined deposition of hafnium oxide ($HfO_x$) and oxidation.

Figure 5:
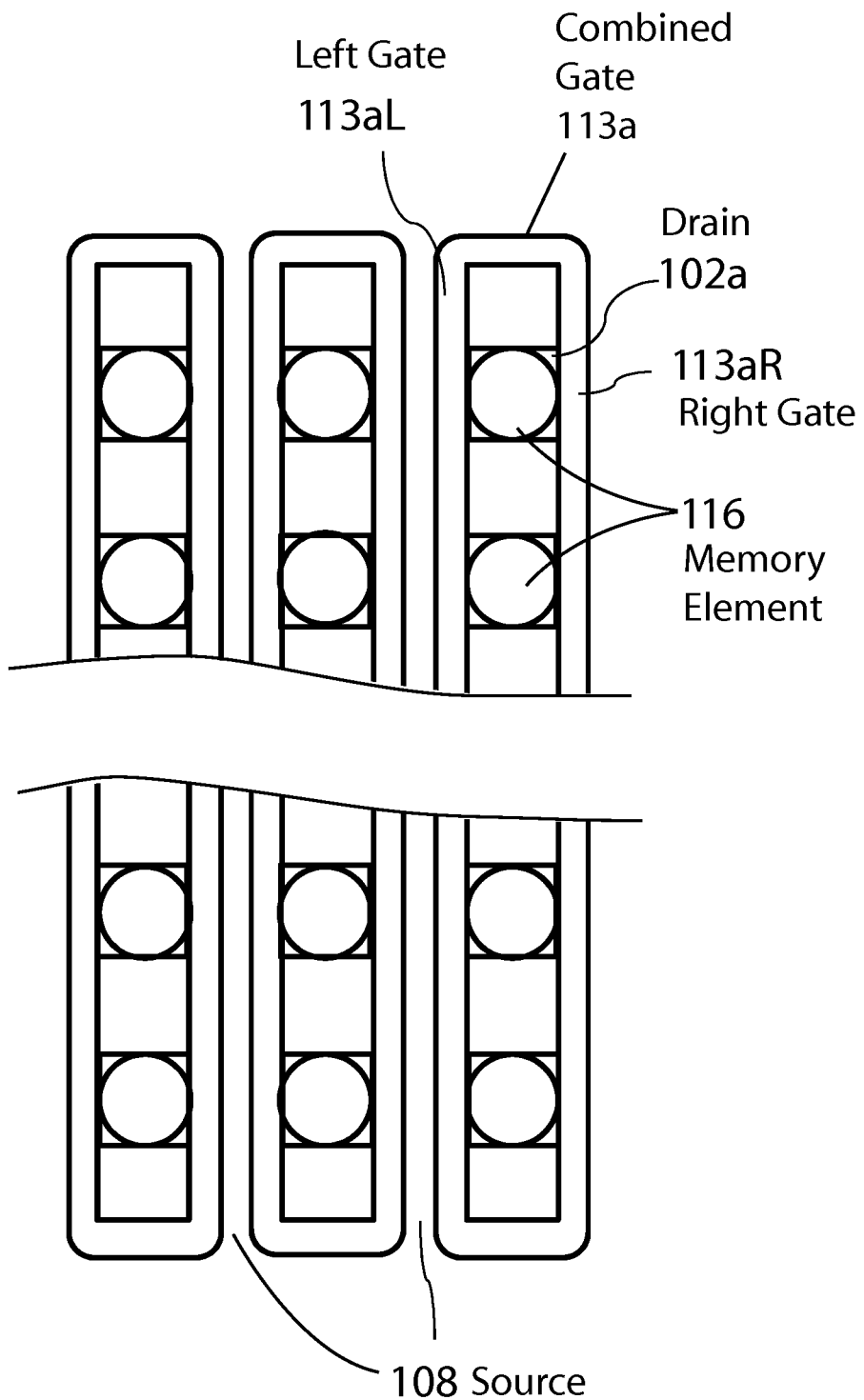
FIG. 5 illustrates a top view of an array structure of an embodiment of the invention.

The pair of the gates 113aL, 113aR in a trench are disconnected/isolated from each other. As shown in FIG. 4A, the gate 113aL is the left gate for a memory element (not shown) on the right and the gate 113aR is the right gate for a memory element (not shown) on the left. The left and right gates on opposite sides of a memory element are electrically connected at the ends as shown in FIG. 5 as will be describe below. The lower portion of each gate extends below the top of the extension layer 109a. Top of the gate overlapped with bottom portion 102b of the drain 102a. A channel 110 for the transistor is thereby formed between the overlaps.

A top view without the bit line and isolation material is illustrated in FIG. 5. In this view the memory elements 116 are circular and sit on top of the contact studs which cannot be seen. A small area of the drains 102a can be seen extending beyond the edges of the memory elements.

The left and right gates 113aL and 113aR for a column of memory element are electrically connected at the end of the array as shown in FIG. 5. The gate pair provides dual channels and 2× current drivability.

A unit cell (illustrated in FIG. 4 across the page) in this embodiment includes a memory element 116, a left gate 113aL, a right gate 113aR and one half of a pair of source lines 108 (each source line is shared with next neighbor cell) in the trenches. The p-type silicon substrate 101 has pillars 101a formed in the substrate between parallel trenches 107. An n-type extension layer 109 is formed on the lower sidewalls of the pillars 101a. The source lines 108 are formed in the bottom of the trenches in contact with the n-type extension layer 109 but the n-type extension layer extends farther up beyond the top of the source line to provide the channel area for the gate. A pair of gates 113aR, 113aL are positioned above the source line and overlap with the n-type extension layer 109 on opposite sidewalls of the pillars. The drain 102a is provided at the top of the pillars by doping with n-type species and the bottom part of the doped drain 102a area overlaps with the top part of the gate. A contact stud 115 is formed on top of the drain. The memory element 116 is fabrication on the contact stud. A bit line 117 connects the memory element in the second direction.

When the memory element is fabricated with 1 $F^2$ with minimum pitch, the unit cell size can be reduced down to 4 $F^2$. Along the first direction, the columns are disposed with a pitch 2 F. Since the source line is shared with an adjacent cell, its contribution is ½F along the second direction. The unit cell is sized as ½F source (L)+F silicon column+½F source (R)=2 F. Therefore 4 $F^2$ cell area is achievable.

Array Structure

As shown in FIGS. 2A-2B a prior art planar channel in FIG. 2A is transformed to a vertical channel in embodiments of the invention as illustrated in FIG. 2B. FIG. 5 illustrates a top view of an array structure embodiment of this disclosure. The memory elements 116 are disposed along the first and the second directions with equal pitches as an (M×N) matrix. M gate line pairs 113aL and 113aR are disposed along the first direction and have the memory elements in between. The pair of gate lines are looped together and electrically connected the ends of the columns. The combined gate line 113a works as a word line. M source lines 108 are disposed also along the first direction under gate lines pair in the trench. The source line is shared by the gate line pair in the trench. N bit lines 117 connecting the memory element 116 are disposed along the second direction.

Figure 6:
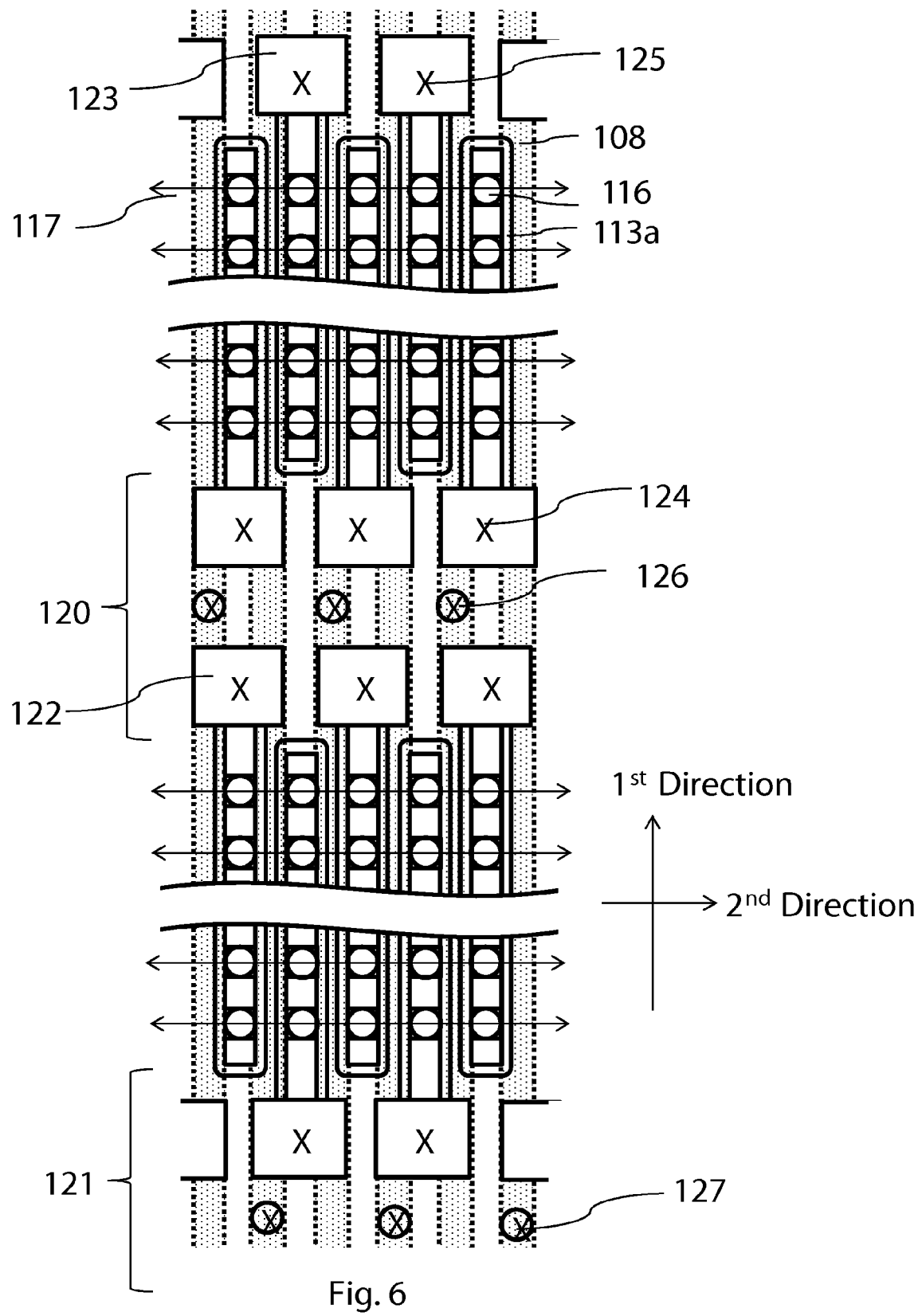
FIG. 6 illustrates a top view of an array structure with a stitching structure according to an embodiment of the invention.
Figure 7:
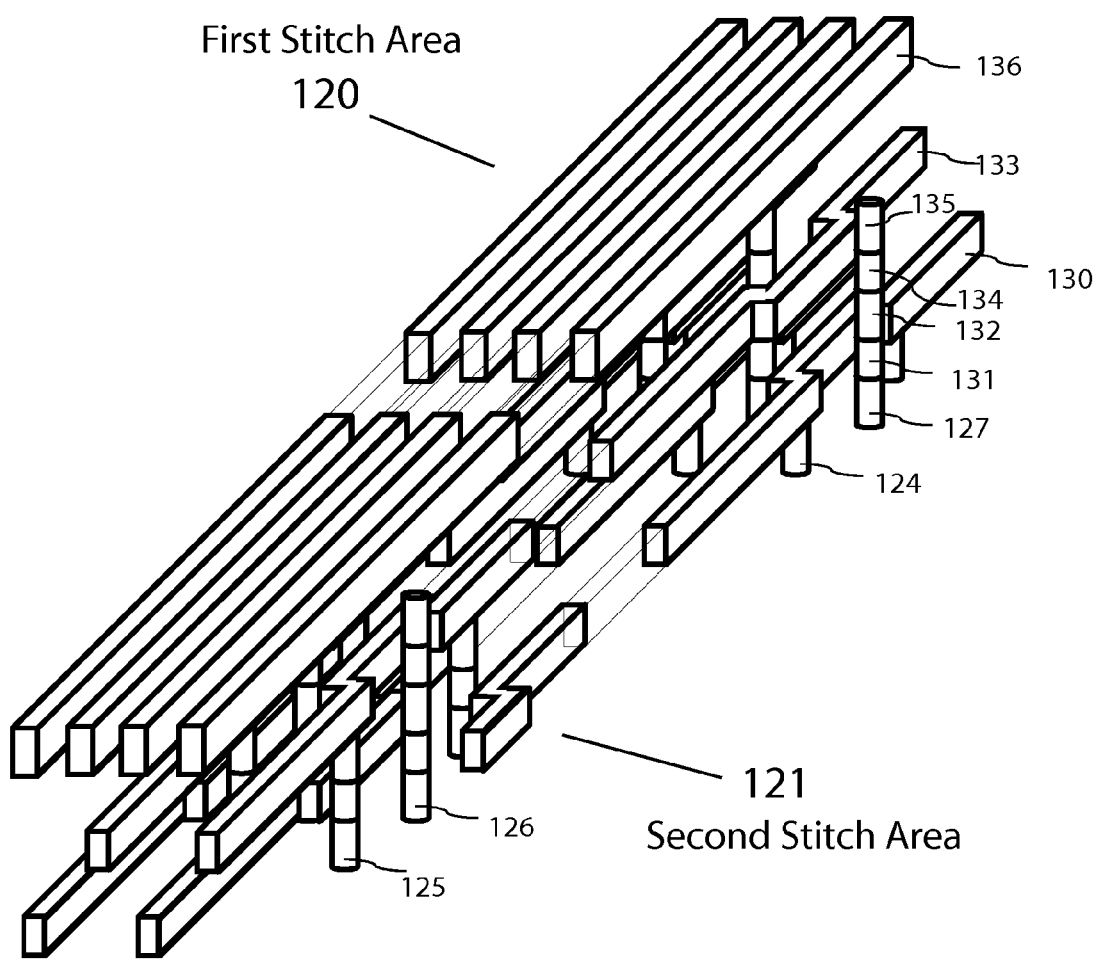
FIG. 7 illustrates 3-dimensional stitching structure according to an embodiment of the invention.

A word line and a source line are stitched along the first direction. FIG. 6 illustrates a top view of an array structure with a stitching structure. A three dimensional scheme is required for the stitching since the 2 lines are disposed in 2 F space (see FIG. 7). At least 3 metal layers are required for the stitching. The first two layers are for word lines and 3rd layer is for source lines, or the first two layers can be for source lines and 3rd can be word lines. Every contact is lifted to the corresponding metal layer with a stud. The first 2 metal layer stitching lines go through/between the studs so that the studs should be disposed with a pitch equal or more than 4 F along the second direction. (FIG. 7 shows one example of contact arrangement to meet the condition.) The X and circle-X symbols are used to distinguish word line contact and source line contact studs respectively. First set of word contacts 124 and source contacts 126 of 1st every other word lines and source lines are disposed in the first stitch area 120 along the 2nd direction with a pitch=4 F. Second set of contacts 125 and 127 of 2nd every other line is disposed in 2nd stitch area 121 in similar way. In FIG. 6 122, 123 are word line contact pads; 122 is a word line contact pad in first stitch area 120; 125 is a word line contact; and 126 is a source contact.

An example of stitching is illustrated three dimensionally in FIG. 7. Every contact is lifted with studs to first stitching layer. First stitch metal line 130 is connected to 1st word line contacts along the first direction, where the stitching line goes around 1st source contact and second source contacts in 1st and 2nd stitch area. 2nd word line contact and source contacts are lifted to 2nd stitch layer. Second stitch line 133 is connected to 1st word line contacts along the first direction, where the stitching line goes around 1st source contact and second source contacts in 1st and 2nd stitch area. Source Line contacts are lifted to 3rd stitching layer. 3rd stitching line connects source contacts along the first direction. In FIG. 7 131 is first metal stud; 132 is first via stud; 134 is second metal stud; 135 is second via stud; and 136 is 3rd metal layer.

Figure 8:
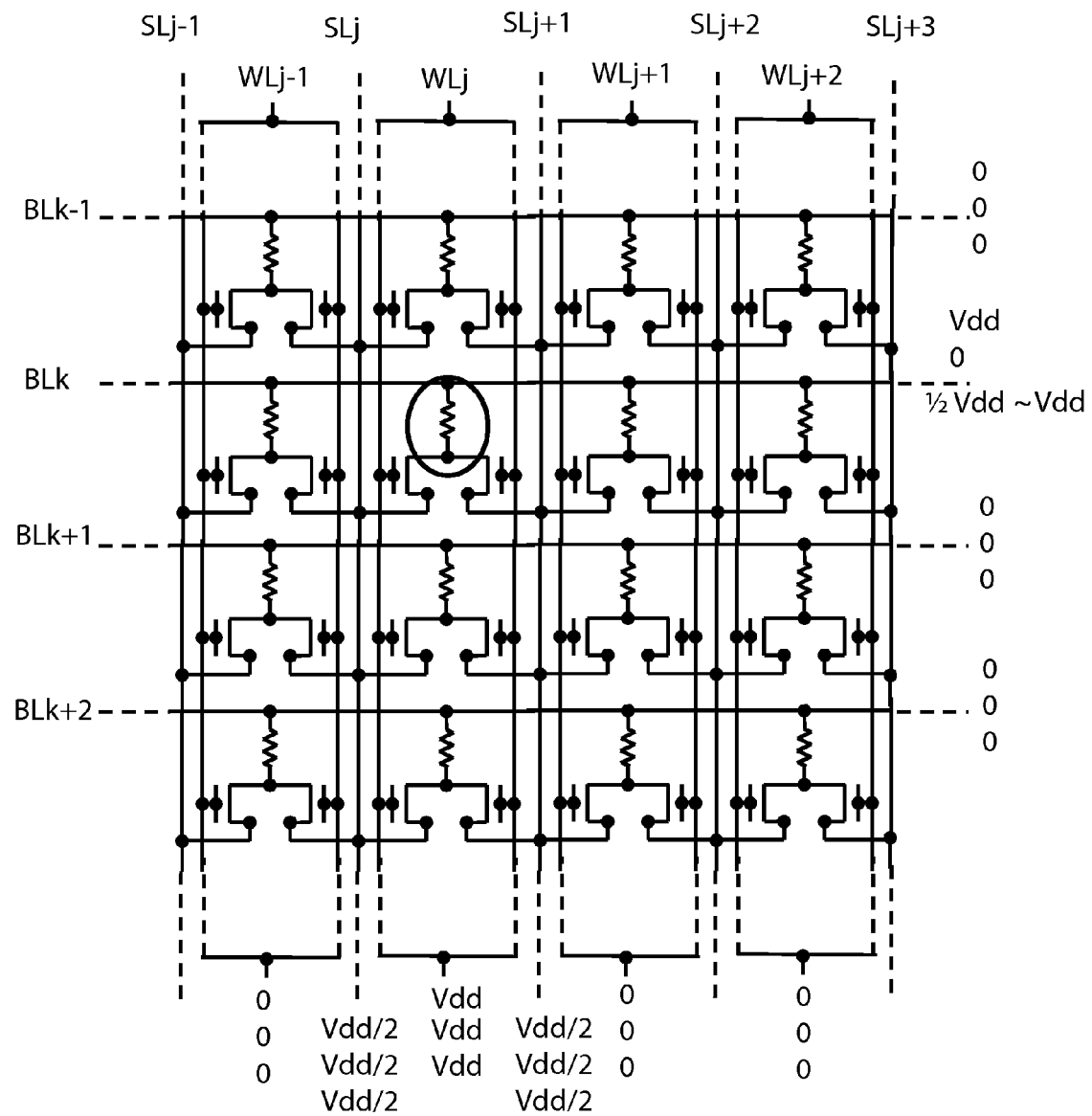
FIG. 8 illustrates equivalent electric circuit diagram of an embodiment of the invention.

FIG. 8 shows an equivalent electric circuit diagram for an embodiment of the invention. A memory cell on row k and column j is selected by a bit line BLk, a word line WLj and a pair of source lines SLj−1 and SLj. The operational voltage for the selected cell is arranged to make a current flow from a bit line to source line at read and write "1" or reverse current for write 1. For unselect cell, it is arranged to have no current. In the figure, one example of voltage set is showed by the sequences of 3 values that include 0, Vdd and Vdd/2.

Fabrication Process

Figure 9:
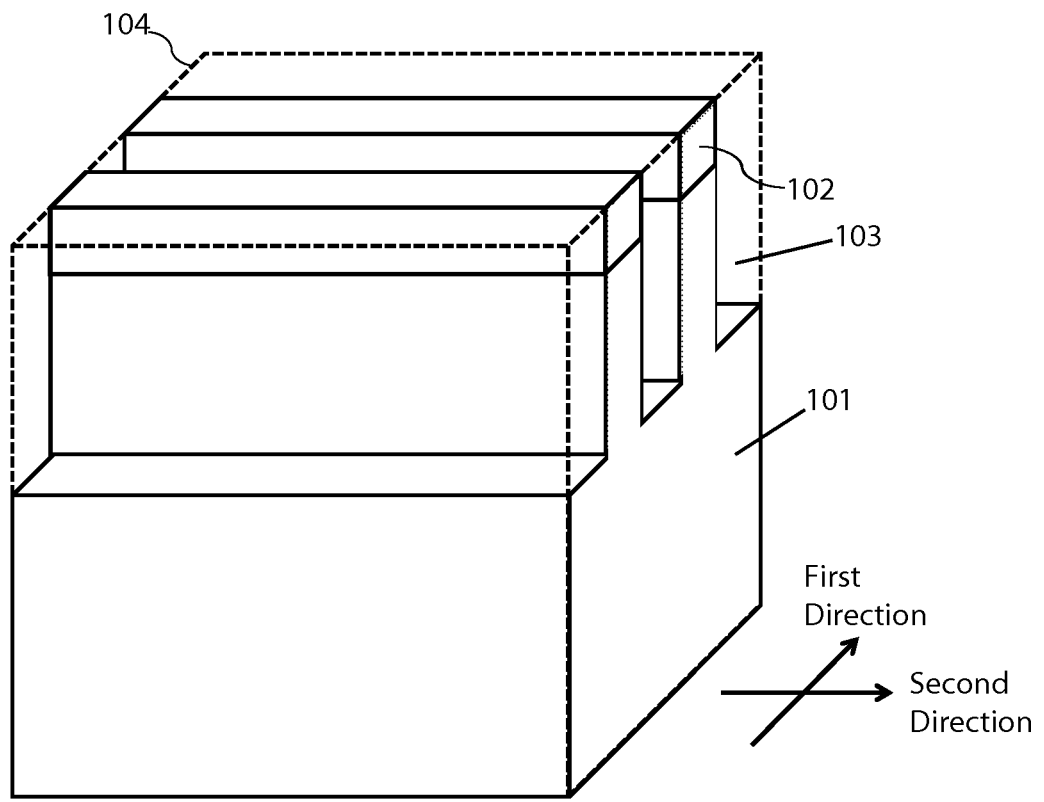
FIG. 9 to FIG. 15 illustrate 3-dimensional views of individual fabrication steps in a method embodiment according to the invention.
Figure 9A:
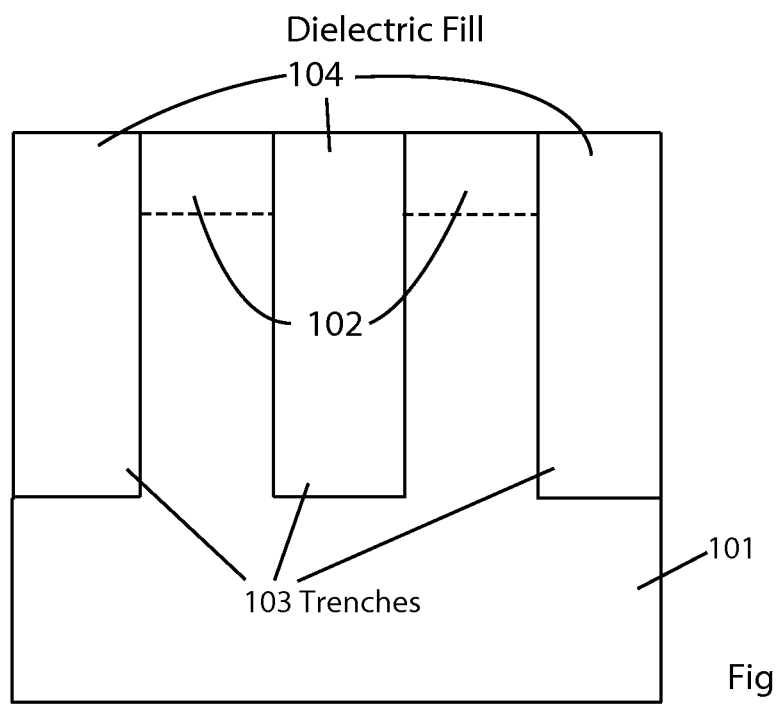
FIG. 9A illustrates a cross section view of the stage of the process illustrated in FIG. 9.

FIG. 9 to FIG. 15 illustrate 3-dimensional views at selected individual fabrication stages of the fabrication embodiment. FIG. 9A illustrates a cross section view of the stage of the process illustrated in FIG. 9. Prior to process stage in FIG. 9, n-species are doped in the p-type substrate silicon. Using a conventional patterning process such as lithography and etching, first set of parallel trenches 103 are built in the substrate 101 extending along the second direction. Dielectric material 104 such as silicon oxide is plugged into the trenches 103 as shown with dashed line using conventional deposition followed by planarization with CMP. The result is a planar surface of alternating parallel lines of dielectric material 104 and the n-type doped tops 102 of the ridges.

Figure 11:
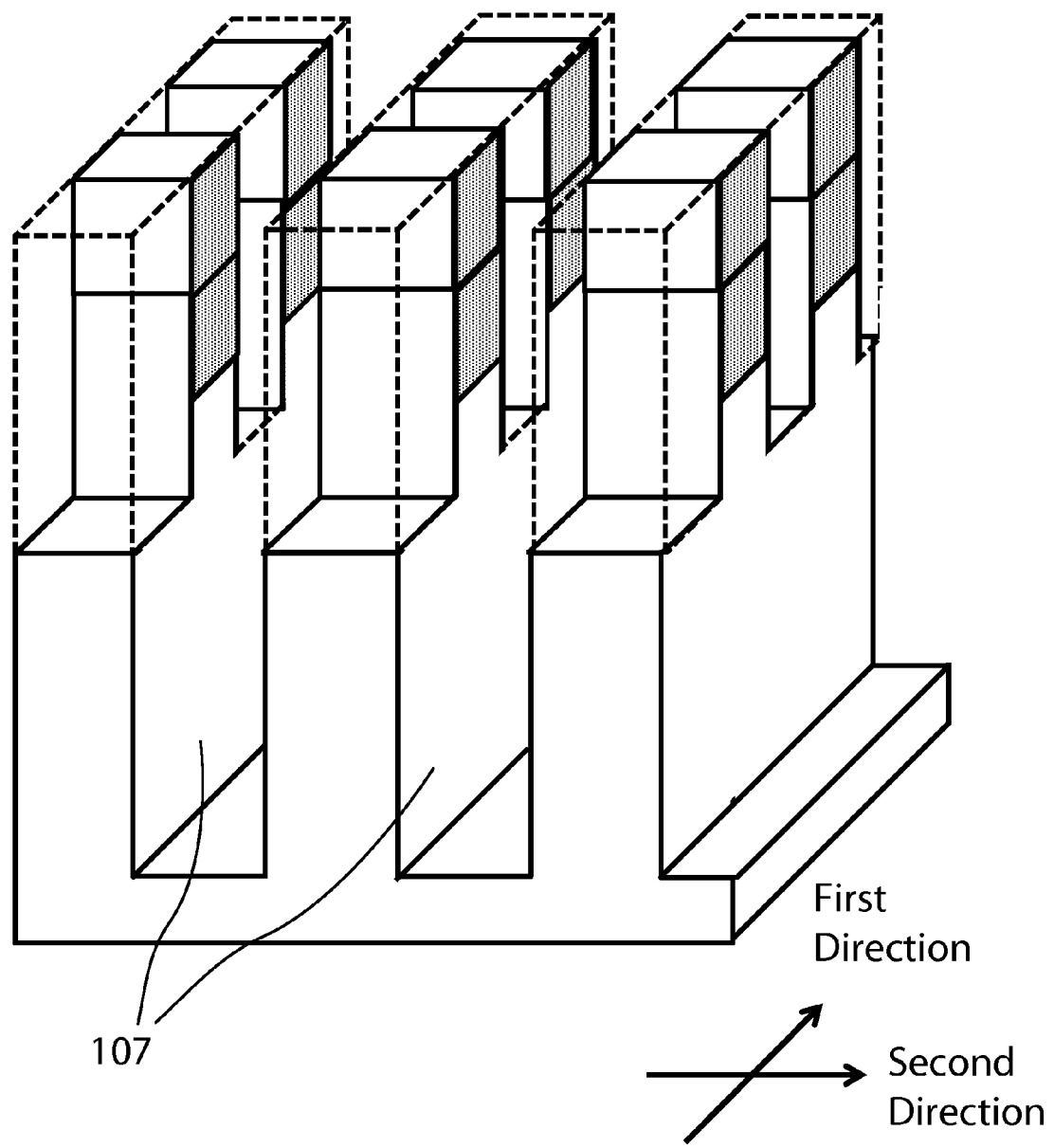

FIG. 10 illustrates the next selected stage of the process. The second set of parallel trenches 105 is fabricated perpendicular to the first set of trenches 103 (i.e. extending along the 1st direction). As shown the depth of the second set of parallel trenches 105 is less than the depth of the first set of trenches 103. The trenches 105 cut into the alternate lines composed of dielectric film line 104, the n-type doped tops 102 of the silicon pillars 101a as shown in FIG. 10. A walls of trenches 105 are composed of alternately appearing rectangular silicon columns comprised by silicon substrate part 101a with n-doped top part 102a and dielectric column 104a. Dielectric film 106 is formed on the surface of the exposed silicon part in the trenches 105 by deposition or thermal oxidation. Another vertical etch breaks through the thin dielectric material on bottom the trenches 105 and forms trenches 107 which are deeper as shown in FIG. 11. This vertical etching leaves the upper portion of the trench walls with a surface layer of dielectric material 106, but the lower portion of the trench walls is the silicon substrate material.

Figure 12:
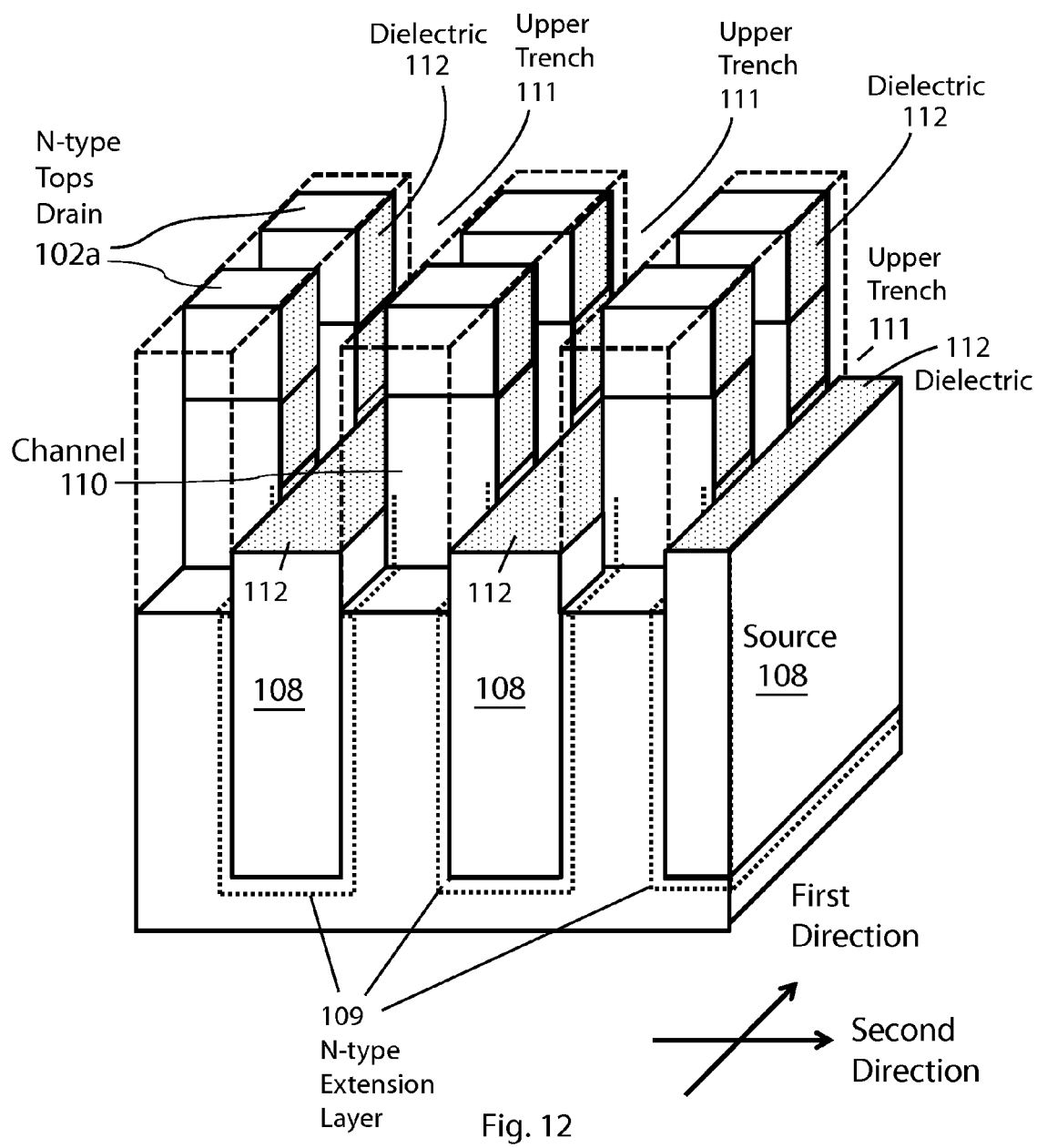

FIG. 12 illustrates the next selected stage of the process. A light diffusion step has been performed on the structure shown in FIG. 11 to form n-type extension layer 109, which is shown by a dotted line, in the lower portion of the trench 107. The n-species are lightly diffused into the exposed silicon in the lower trench walls but the diffusion is blocked by dielectric layer 106 on the upper part of the trench walls. An n-type extension layer 109 is therefore built on lower trench wall below the dielectric 106 as shown in FIG. 12. Next poly silicon for source line 108, which is highly doped with n-species, is plugged into the trenches 107 shown in FIG. 12. The top of the doped poly-silicon source 108 is recessed below the upper extent of the n-type extension layer 109. The relationship between top of the doped poly-silicon 108 and upper extent of the n-type extension layer 109 is shown in FIG. 4A in cross section for reference. The remaining dielectric 106 is removed by a light etch.

Next a new thin layer of gate dielectric material 112 is formed in the upper trench area 111. This layer of dielectric material forms the gate dielectric and insulates the top of the source 108. The gate dielectric material 112 in this embodiment is achieved by oxidizing the exposed silicon in the walls of the upper trench area and the top of the source before the gate material is deposited in the trench. See FIG. 4A for a cross section view of gate dielectric material 112.

Thus the gate dielectric material 112 in this embodiment is silicon dioxide formed to separate the electrically conductive gate material from the source line 108, the upper portion of n-type extension layer 109, and the drain 102a. The gate dielectric material 112 can also be simply formed by oxidation of substrate, for example by combined deposition of hafnium oxide ($HfO_x$) and oxidation.

Figure 13:
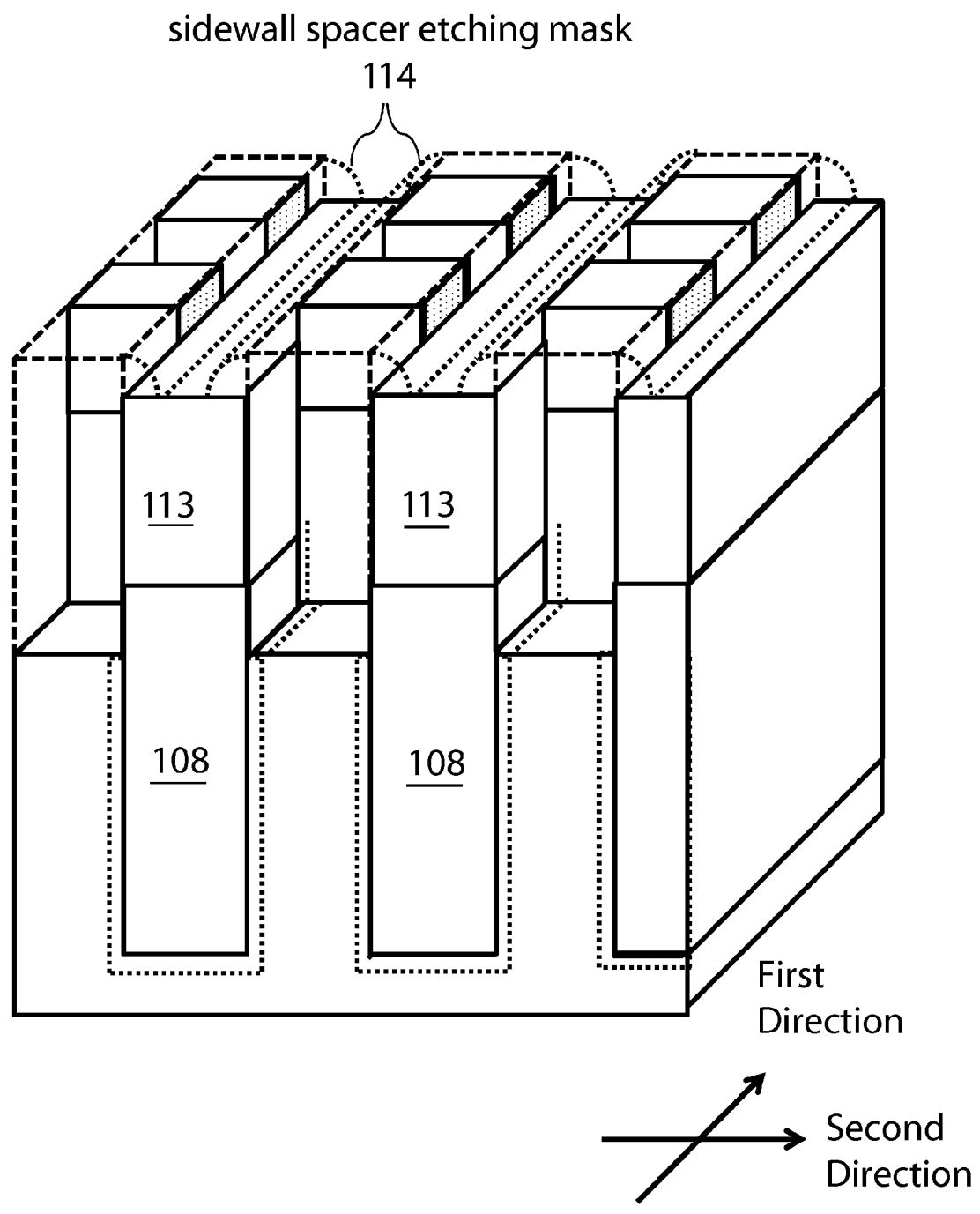

In FIG. 13, an electrically conductive film 113 is plugged in the trench 111 and recessed down to middle of the drain column 102a. The electrically conductive film 113, which will be patterned into the gate electrodes, is deposited over the gate dielectric material 112, which is not shown in this view.

Figure 14:
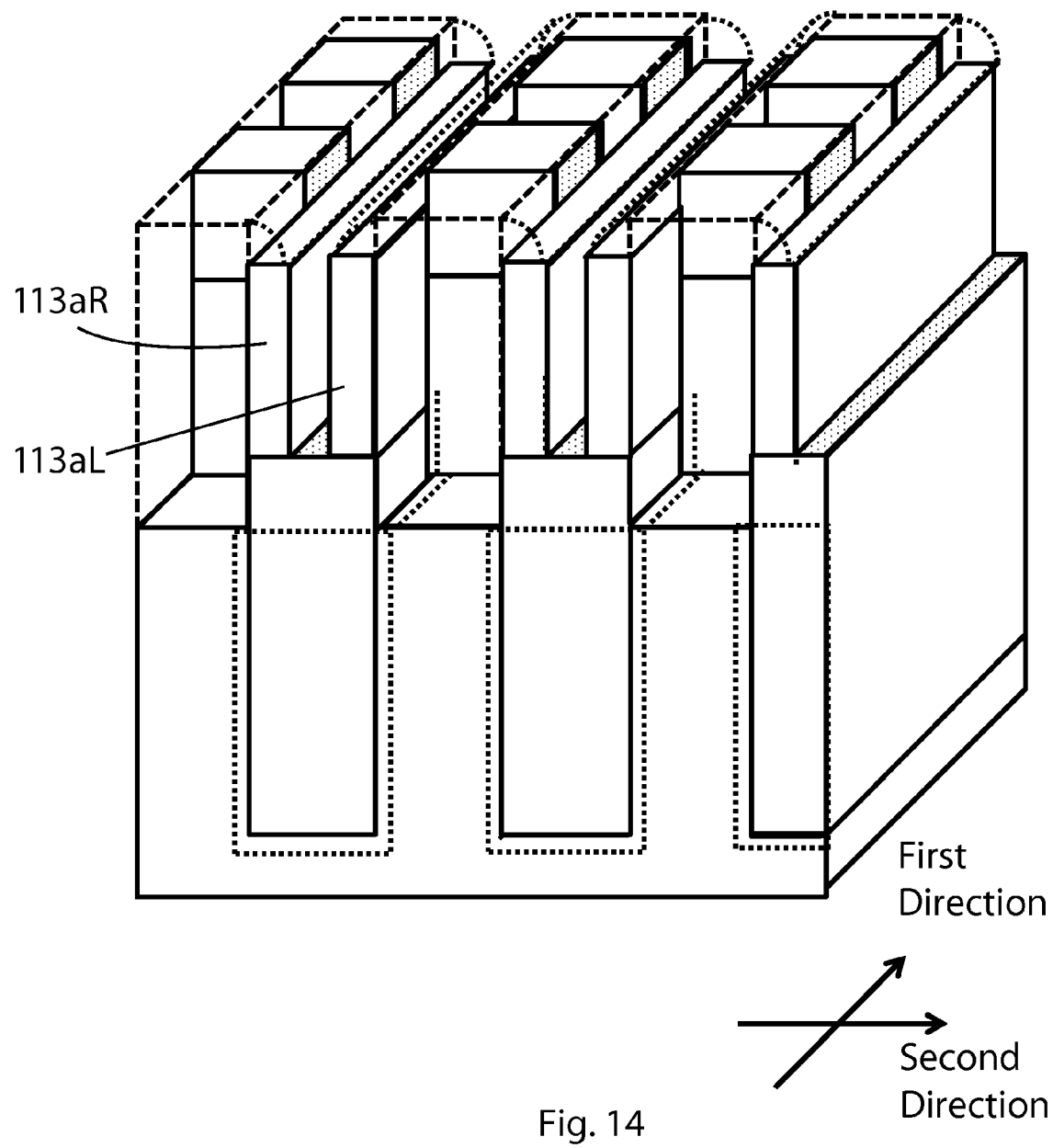
Figure 15:
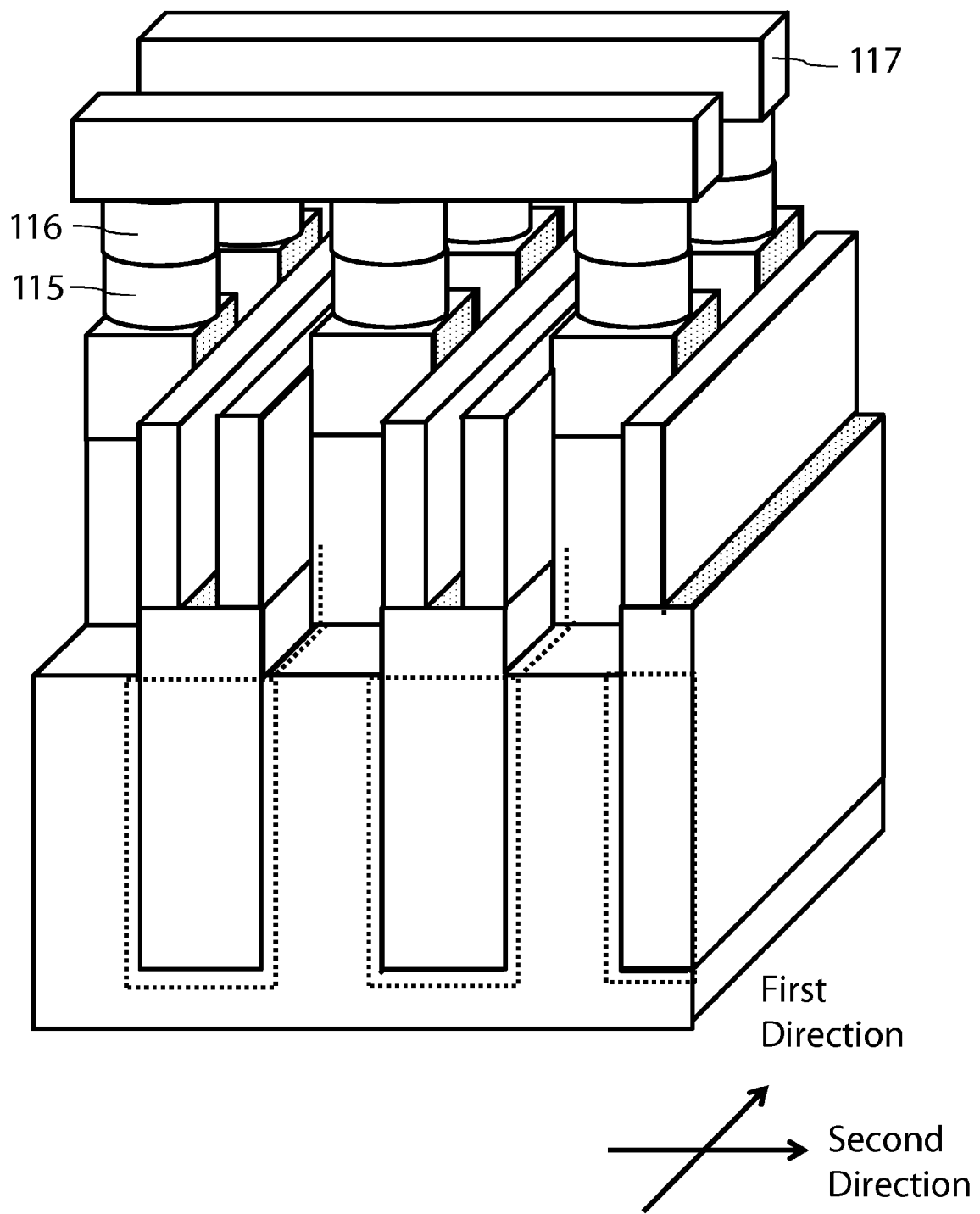

A mask 114 for etching the film 113 into the two gate electrodes is patterned next. A dielectric film having enough etching selectivity with respect to the conductive film 113 is first deposited with a thickness less than a half of a width of the trench 111. A vertical etch then forms a sidewall spacer etching mask 114. A vertical etch with the sidewall spacer mask 114 separates conductive film plug 113 into the two sidewall gates 113aR, 113aL in the trench as illustrated in FIG. 14. After the gate electrodes have been etched, the process proceeds in a straightforward manner with the fabrication of the contact stud 115, memory element 116 and bit line 117 as shown in FIG. 15.

While the present invention has been shown and described with reference to certain embodiments, it is to be understood that certain alterations and modifications thereto are nevertheless included the true spirit and scope of the present invention. Thus the scope of the invention should be determined by the appended claims and their legal equivalents, rather than by examples given.

The invention claimed is:

1. An array of resistive memory cells comprising:
   a first resistive memory element; and
   a first vertical dual channel transistor with a first drain positioned under the first resistive memory element and electrically connected to the first resistive memory element, the first transistor including first and second vertical channels controlled by first and second gates respectively connecting first and second sources to the first drain.

2. The array of resistive memory cells of claim 1 further comprising a second resistive memory element adjacent to the first resistive memory element, the second resistive memory element being positioned over and electrically connected to a second drain of a second vertical dual channel transistor with a pair of gates that shares the second source with first vertical dual channel transistor.

3. The array of resistive memory cells of claim 2 wherein the second source that is shared by the first and second vertical dual channel transistors is disposed in a trench that extends between the first and second resistive memory elements.

4. The array of resistive memory cells of claim 3 wherein the trench with the second source has a predetermined sidewall area with a conductivity type equal to the conductivity type of the second source, the predetermined sidewall area extending vertically above a top of the second source on opposing first and second sides of the trench to contact a gate dielectric material and vertically overlap the first gate for the first vertical dual channel transistor and one of the gates for the second vertical dual channel transistor above the second source and thereby form channels in the first and second vertical dual channel transistors.

5. An array of resistive memory cells including repeating cell units comprising:
   a resistive memory element; and
   a vertical dual channel transistor with a drain positioned under the resistive memory element and electrically connected to the resistive memory element, the transistor including first and second vertical channels controlled by first and second gates disposed on left and right sides of the drain, the first gate extending downward from the drain to overlap with a first extended conductivity region for a first source line extending along the left side of the drain and the second gate extending downward from the drain to overlap with a second extended conductivity region for a second source line extending along the right side of the drain, the first and second gates being separated from the drain and first and second extended conductivity regions by gate dielectric material.

6. The array of claim 5 wherein the first and second source lines are disposed in bottoms of first and second trenches and the first and second extended conductivity regions are formed in sidewalls of the first and second trenches and extend above the first and second source lines to vertically overlap with gate dielectric material.

7. The array of claim 5 wherein the first and second gates are interconnected at an end of a column of cells.

8. An array of memory cells arranged in rows and columns with vertical dual channel transistors electrically connected to memory elements comprising:
- a doped silicon substrate with a first conductivity type;
- each memory element being disposed over a drain for a transistor formed on a pillar formed from the substrate, the drain having a second conductivity type;
- a set of parallel trenches formed in said substrate between columns of pillars with each trench being disposed between first and second columns of memory elements, each trench containing a source line that is shared by a memory element in the first column and a memory element in the second column, each trench containing a first gate electrode formed beneath the memory element in the first column and a second gate electrode formed beneath the memory element in the second column; and
- each pillar having first and second implanted extension areas with a conductivity type equal to the conductivity type of the source line, the first and second implanted extension areas being adjacent to the first and second source line on opposite sides of the pillar, each implanted extension area extending vertically above a top of the source line to vertically overlap with the gate dielectric layer and the gate electrode.

9. An array of resistive memory cells comprising:
- a plurality of columns of memory elements wherein each memory element is formed above a drain of vertical channel transistor;
- a plurality of source lines wherein a source line is buried in a trench located between the columns of memory elements and the source line is shared by adjacent columns; and
- a gate electrode loop disposed on a gate dielectric layer for each column of memory element that includes left and right electrodes for left and right channels formed between the drains and first and second source lines that are adjacent to the column of memory elements.

10. The array of claim 9 wherein a selected lower area of sidewalls of each trench is implanted with selected species as an extension of the source line conductivity to form left and right channels.

* * * * *